United States Patent [19]
Kimura

[11] Patent Number: 6,124,056
[45] Date of Patent: Sep. 26, 2000

[54] BATTERY HOLDER

[75] Inventor: Takao Kimura, Kanagawa, Japan

[73] Assignee: The Whitaker Corporation, Wilmington, Del.

[21] Appl. No.: 09/311,201

[22] Filed: May 13, 1999

[30] Foreign Application Priority Data

May 29, 1998 [JP] Japan .................................. 10-148549

[51] Int. Cl.$^7$ .......................... H01R 13/22; H01M 2/10
[52] U.S. Cl. .................. 429/100; 429/96; 429/97
[58] Field of Search ................ 429/96, 97, 98, 429/100

[56] References Cited

U.S. PATENT DOCUMENTS

| | | | |
|---|---|---|---|
| 4,371,595 | 2/1983 | Suwa | 429/98 |
| 5,098,802 | 3/1992 | Kainoh | 429/178 |
| 5,922,489 | 7/1999 | Adachi | 429/100 |
| 5,931,693 | 8/1999 | Yamazaki | 439/500 |

Primary Examiner—Maria Nuzzolillo
Assistant Examiner—Tracy Dove

[57] ABSTRACT

Battery holder (1) comprises a housing (2) having retaining walls (6, 8) located at both ends of the housing and electrical contacts (60, 80) secured in the retaining walls (6, 8). The electrical contact (80) has resilient contact arms (84) arranged on both sides of base section (4) of the housing (2). Front end sections (86) of the contact arms (84) have stop members (88) positioned on both sides of diametrically-opposed points (112) of battery (110), the purpose of which is to prevent the battery (110) from getting loose. In addition, at a bottom edge (84d) of the contact arms (84), contact tabs (90) are provided that are disposed against diametrically-opposed points (112) and make electrical connection with the battery (110). Electrical contact (60) is disposed in a slot (18) in the base section (4) and it has a contact member (65a) that electrically connects with the battery (110).

8 Claims, 3 Drawing Sheets

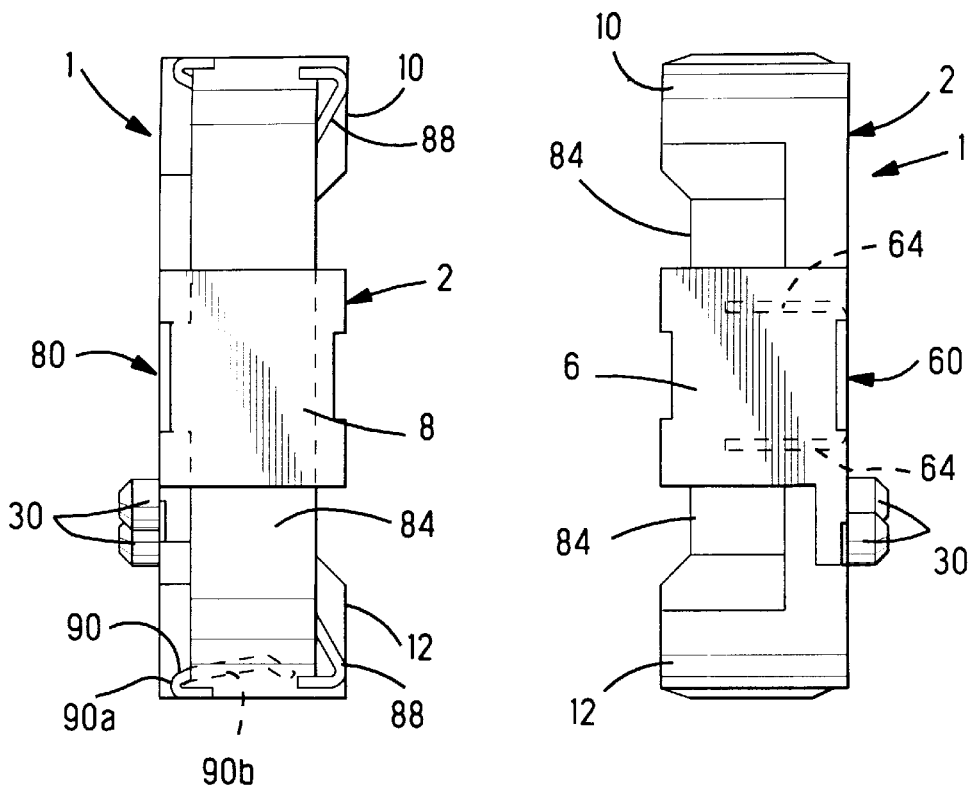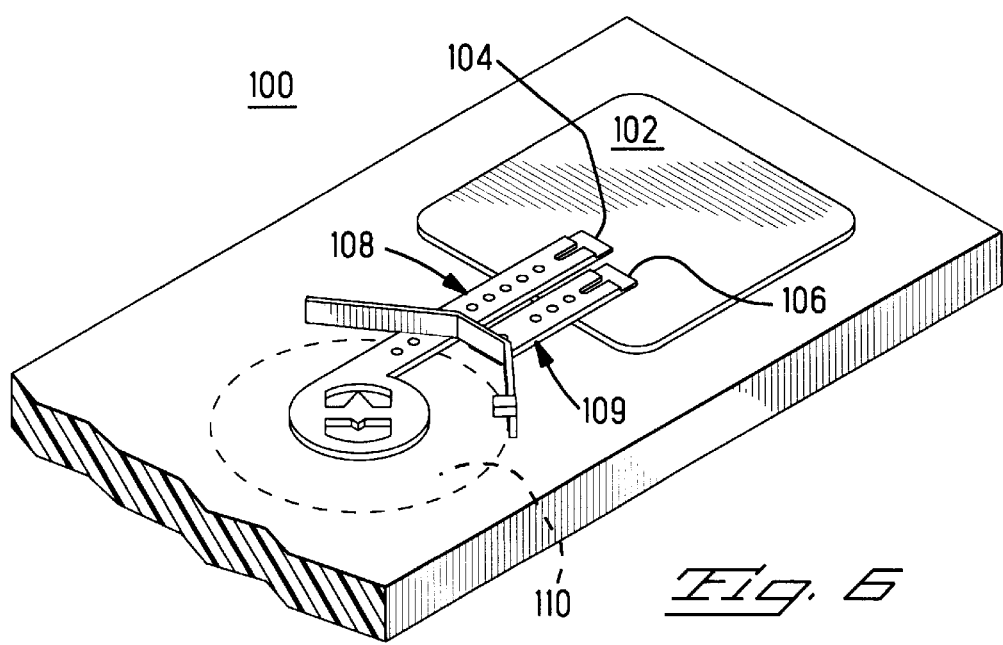

BATTERY HOLDER

FIELD OF THE INVENTION

The present invention relates to battery holders, especially to battery holders for holding coin-type batteries.

BACKGROUND OF THE INVENTION

At the present time, batteries of coin configuration are used in portable telephones and other electronic equipment. An example of a battery holder is disclosed in U.S. Pat. No. 5,098,802 for battery leads. As can be seen from FIG. 6, battery holder 100 includes electrical leads 108, 109 forming electrical contacts with battery 110 that are connected to conductive pads 104, 106 on circuit board 102. An inner end of the lead 108 engages a flat surface of the battery 110, while the lead 109 has two arms at an inner end that electrically connect with a side surface of the battery 110.

Since the leads 108, 109 extend to one side of the battery 110, it is necessary to provide a separate retaining device to restrict the movement of the battery 110 in vertical and horizontal directions, thus a larger size battery holder is required. Another disadvantage is the fact that a retaining member for retaining the battery is made of plastic and can be easily broken.

Therefore, the purpose of the present invention is to provide a battery holder free from the above-mentioned disadvantages in which the electrical contacts can be used as retaining means, resulting in a long service life, small size and in a small number of parts.

SUMMARY OF THE INVENTION

The present invention is directed to a battery holder having a set of electrical contacts secured in a mutually-opposed manner in an insulating housing that electrically engage with corresponding electrodes of a battery of coin configuration, retaining means for retaining the battery within the housing and one of the electrical contacts has resilient contact arms, the length of which is such that their ends cross a diameter of the battery and have battery-engaging members located on both sides of diametrically-opposed points of the battery, the purpose of which is to prevent the battery from becoming loose, thereby forming the retaining means.

The battery-engaging members are disposed at front ends of the contact arms.

The contact arms have front end sections as integral parts of the contact arms that electrically engage with a side surface of the battery.

The front end sections are positioned at diametrically-opposed points of the battery.

Each of the battery-engaging members is in the form of two tabs with a contact tab being located between the two tabs.

A battery holder for holding a battery having electrodes comprises an insulating housing having a battery-receiving cavity for receiving the battery therein, a first electrical contact having a contact member extending into the battery-receiving cavity for electrical connection to an electrode of the battery, a second electrical contact having resilient arms for electrical connection to another electrode of the battery, wherein battery-engaging members are located at outer ends of the resilient arms and having retaining members for engaging the battery to retain the battery within the battery-receiving cavity and contact members for electrical connection to another electrode of the battery.

BRIEF DESCRIPTION OF THE DRAWINGS

An embodiment of the present invention will now be described by way of example with reference to the accompanying drawings in which:

FIGS. 5A and 5B are end views of the battery holder shown in FIG. 1;

FIG. 5A is a left side view of FIG. 1;

FIG. 5B is a right side view of FIG. 1.

FIG. 6 is a perspective view of a conventional battery holder.

DETAILED DESCRIPTION OF THE INVENTION

Figure 1:
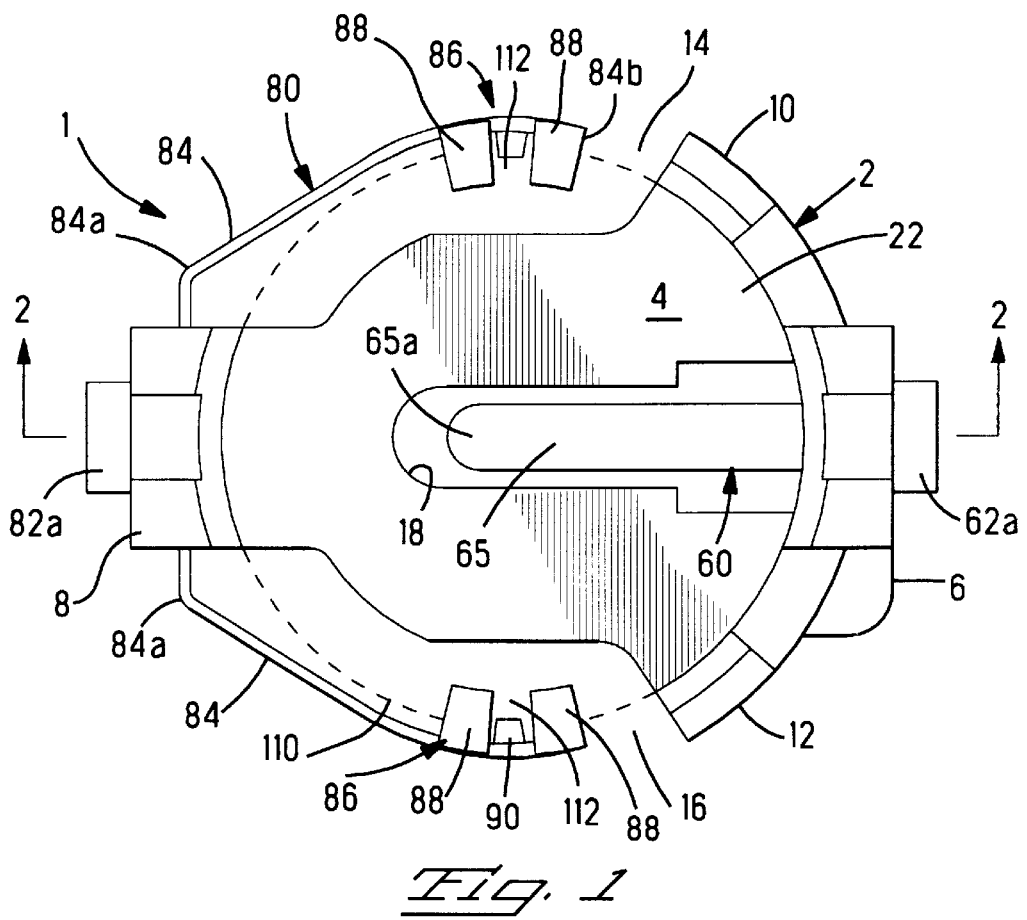
FIG. 1 is a top plan view of a battery holder according to the present invention.
Figure 2:
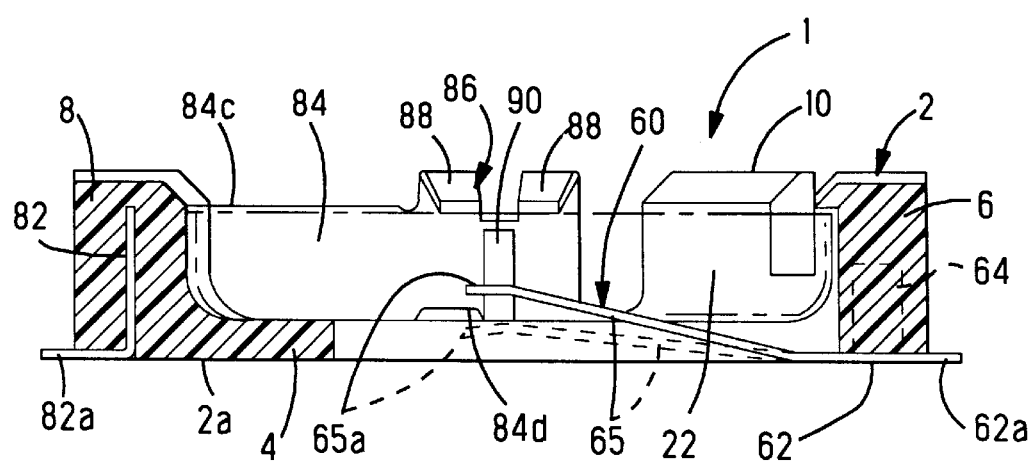
FIG. 2 is a cross-sectional view taken along line 2—2 of the battery holder shown in FIG. 1.

As can be seen from FIGS. 1 through 5, battery holder 1 includes a dielectric housing 2 fabricated from a suitable insulating plastic material, first electrical contact 60, and second electrical contact 80 mounted on housing 2. The housing 2 has a flat base 4 and retaining walls 6, 8 extending upwardly from the flat base 4 and located at opposite ends thereof. At both sides of the retaining wall 6, arcuate-shaped posts 10, 12 are located; thus, retaining walls 6, 8 and arcuate-shaped posts 10, 12 form a battery-receiving cavity 22. In FIGS. 1 and 2, the outline of battery 110 placed in the battery-receiving cavity 22 is shown. At the left side of the base 4 (that is at the side of retaining wall 8), cut-outs 14, 16 are located of approximately the same width as the width of the retaining wall 8 that extend to the posts 10, 12. A T-shaped slot 18 with an arcuate inner end is located in the base 4 that extends from the retaining wall 6 to approximately the center of the base 4.

Second electrical contact 80, that electrically engages with a positive electrode of the battery 110, is secured to the retaining wall 8, and first electrical contact 60, that electrically engages with a negative electrode of the battery 110, is secured to the retaining wall 6. Both electrical contacts 60, 80 are embedded in the housing 2 by means of insert molding. Base section 82 (see FIG. 2) of the electrical contact 80 embedded in the retaining wall 8 extends downward and to the outside thereby forming termination section 82a. In addition, the electrical contact 80 has two resilient contact arms 84 that extend from both sides of the base section 82 and the retaining wall 8. The resilient contact arms 84 joined to the base 4 by means of bent sections 84a extend along the battery 110 from opposing directions. Front ends 84b of the resilient contact arms 84 extend beyond diametrically-opposed points 112 of the battery 110, and front end sections 86 of the resilient contact arms 84 have the same curvature as the battery 110 and define battery-engaging members.

As can be seen from FIGS. 1 and 2, at upper edges 84c of the front end sections 86 of the contact arms 84, retaining members 88 are located in the form of two tabs spaced from each other and bent slightly downward. At lower edges 84d of the contact arms 84, contact tabs 90 are located by bending upward from the lower edges 84d so that their position coincides with the diametrically-opposed points 112 of the battery 110. The contact tabs 90 first extend down from the lower edges 84d, and then they are bent upwards extending along inner surfaces of front end sections 86, thereby resulting in high resilience due to the considerable overall length of the tabs. Contact tabs 90 are positioned between tabs 88. The contact tabs 90 form an electrical connection with the battery 110, and the retaining members 88 retain the battery 110 in the battery-receiving cavity 22. The members 88 are positioned on both sides of the diametrically-opposed points 112 of the battery 110, thereby not only preventing the battery 110 from getting loose but also restraining battery movement relative to the base 4. The arrangement of the retaining members 88 and the contact tabs 90 provide for a reliable retention and electrical connection of the battery 110.

Figure 3:
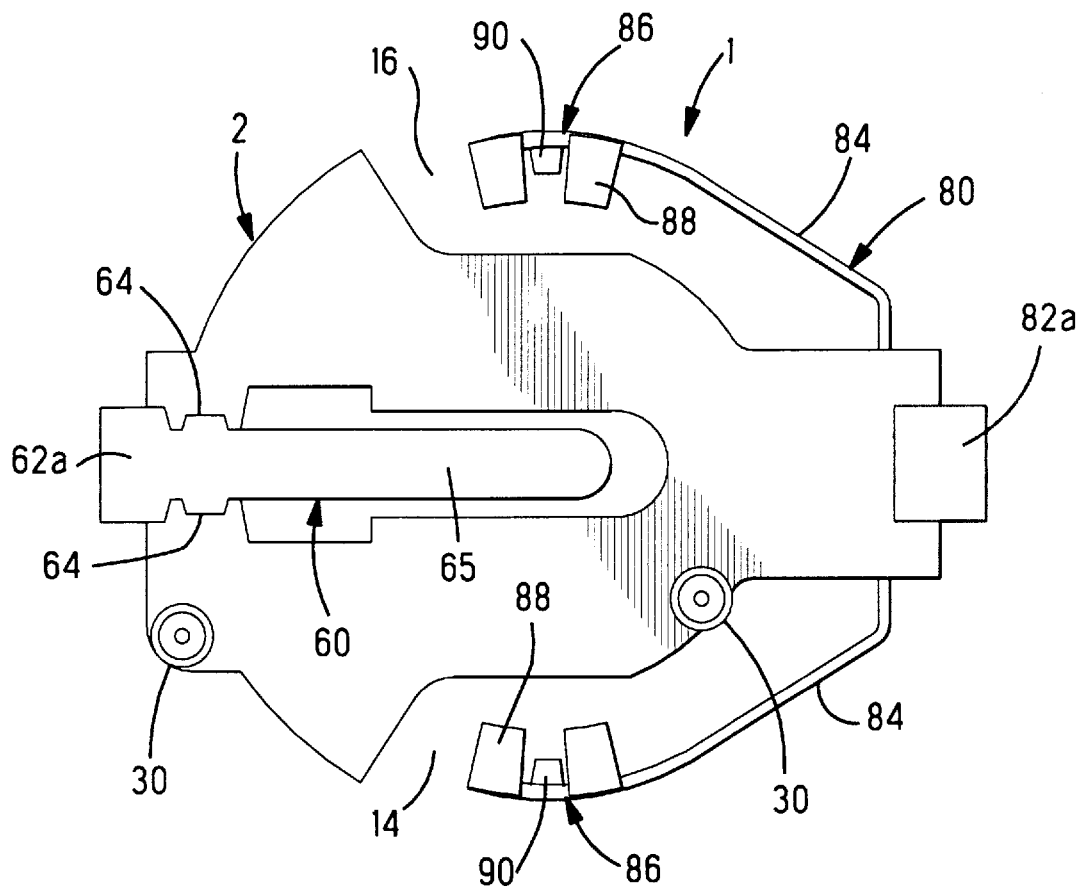
FIG. 3 is a bottom view of the battery holder shown in FIG. 1.
Figure 4:
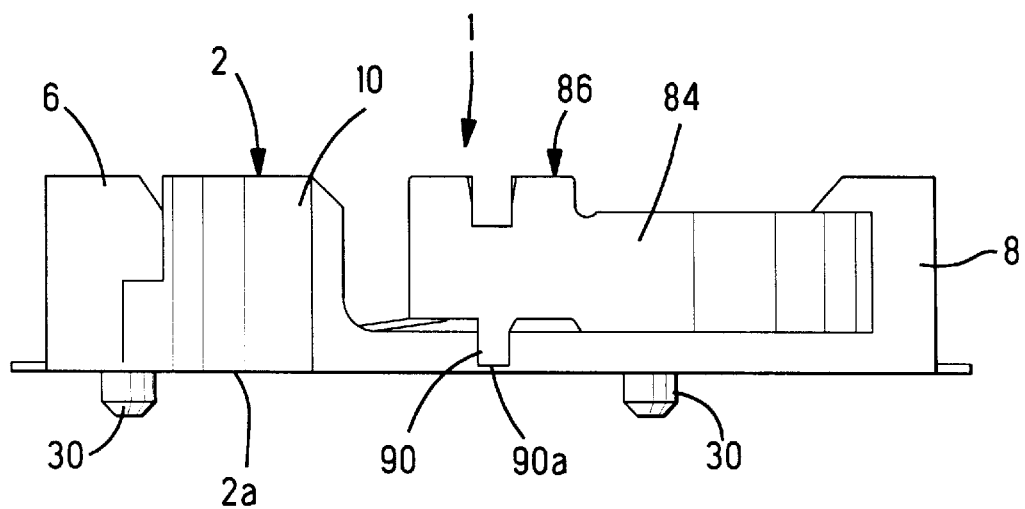
FIG. 4 is a side view of the battery holder shown in FIG. 1.

The electrical contact 60 is clearly depicted in FIGS. 1 through 3. It has a straight portion 62 located in the same plane as bottom surface 2a of the housing 2 with lugs 64 embedded in the housing 2 within retaining wall 6. The lugs 64 have barbs preventing the electrical contact 60 from slipping out of the housing. Similar to the electrical contact 80, the electrical contact 60 has a termination portion 62a extending outside the housing. Contact portion 65 of the electrical contact 60 protrudes inside the housing 2 through its bottom 2a, and it has contact member 65a at an outer end that makes an electrical connection with the battery 110. When the battery 110 is inserted in the battery-receiving cavity 22 of the housing 2, the contact portion 65 is deflected within the slot 18 as shown in broken lines in FIG. 2. Contact portion 65 is a cantilever.

As mentioned above, posts 10, 12 are positioned on both sides of the retaining wall 6 and they have curved inner surfaces to match the configuration of the battery 110. The posts 10, 12 provide protection for the battery 110 from external interference and prevent the battery from sliding relative to the base 4.

On the bottom surface 2a of the housing 2, posts 30 protrude therefrom and they are provided for accurate positioning of the housing 2 on a circuit board (see FIG. 3). Lower ends 90a of the contact tabs 90 of the contact arms 84 are located near the bottom surface 2a of the housing 2. The resilience of the contact tabs 90 is increased by increasing their length as cantilever portions 90b extend inwardly toward spaced tabs 88.

Above, a detailed explanation concerning the preferred embodiment of the present invention has been provided; however, the embodiment is only one example and the invention is not limited thereto. The invention covers such modifications as, for example, different configurations of housing or contact arms without omitting essential features of the invention, which can be easily made by experts in the field.

Since the battery holder according to the present invention has electrical contacts opposedly disposed in an insulating housing that are intended to form electrical connection with electrodes of a battery, and one of the contacts has resilient contact arms extending beyond diameter points of the battery with each contact arm having retaining members located at both sides of the diameter point preventing the battery from getting loose, the holder can be made smaller and with fewer parts.

What is claimed is:

1. A battery holder for holding a battery, comprising an insulating housing having a base and retaining walls extending upwardly from the base defining a battery-receiving cavity in which the battery is to be received;

a first electrical contact having one end secured to one of the retaining walls and a contact member extending into the battery-receiving cavity for electrical connection to an electrode of the battery;

a second electrical contact secured to the other of the retaining walls and having resilient contact arms extending outwardly therefrom toward the one of the retaining walls; and battery-engaging members at outer ends of the resilient contact arms having retaining members for engaging the battery to retain the battery within the battery-receiving cavity and contact members for electrical connection to another electrode of the battery.

2. A battery holder as claimed in claim 1, wherein posts extend upwardly from the base on each side of the one of the retaining walls and having arcuate surfaces facing the battery-receiving cavity.

3. A battery holder as claimed in claim 1, wherein the base has a slot, the contact member of the first electrical contact is a cantilever portion extending along the slot and movable therewithin.

4. A battery holder as claimed in claim 1, wherein the retaining members comprise spaced tabs extending inwardly from upper edges of the resilient contact arms.

5. A battery holder as claimed in claim 4, wherein the contact members comprise contact tabs extending inwardly from bottom edges of the resilient contact arms.

6. A battery holder as claimed in claim 4, wherein the retaining members are positioned on both sides of diametrically-opposed points of the battery.

7. A battery holder as claimed in claim 6, wherein the contact tabs are disposed between the spaced tabs.

8. A battery holder as claimed in claim 7, wherein cantilever contact portions of the contact tabs extend inwardly toward the spaced tabs.

* * * * *